(12) United States Patent
Liu et al.

(10) Patent No.: US 9,680,130 B2
(45) Date of Patent: Jun. 13, 2017

(54) DISPLAY DEVICES, DISPLAY PANELS AND MANUFACTURING METHODS THEREFOR

(71) Applicants: SHANGHAI TIANMA MICRO-ELECTRONICS CO., LTD., Shanghai (CN); TIANMA MICRO-ELECTRONICS CO., LTD., Shenzhen (CN)

(72) Inventors: Liyuan Liu, Shanghai (CN); Canjun Xiao, Shanghai (CN); Mu Lou, Shanghai (CN); Zhiyong Xiong, Shanghai (CN); Zhengzhong Chen, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/077,922

(22) Filed: Mar. 23, 2016

(65) Prior Publication Data

US 2017/0062764 A1  Mar. 2, 2017

(30) Foreign Application Priority Data

Aug. 28, 2015 (CN) .......................... 2015 1 0540234

(51) Int. Cl.
*H01L 51/52* (2006.01)
*H01L 27/32* (2006.01)

(52) U.S. Cl.
CPC ...... *H01L 51/5268* (2013.01); *H01L 27/3244* (2013.01); *H01L 51/5237* (2013.01); *H01L 51/5275* (2013.01)

(58) Field of Classification Search
CPC ............. H01L 51/5268; H01L 27/3244; H01L 51/5237; H01L 51/5275; H01L 51/56
See application file for complete search history.

(56) References Cited

U.S. PATENT DOCUMENTS

| 2004/0150325 A1* | 8/2004 | Yamakita | G02F 1/167 313/498 |
| 2009/0212687 A1* | 8/2009 | Cok | H01L 51/5265 313/504 |
| 2011/0147777 A1* | 6/2011 | Konno | H01L 51/5275 257/98 |

\* cited by examiner

*Primary Examiner* — Karen Kusumakar
(74) *Attorney, Agent, or Firm* — Kilpatrick Townsend & Stockton LLP (57) ABSTRACT

A display device, a display panel and a manufacturing method therefor are disclosed. The display panel can include a cover plate; an array substrate disposed opposite to the cover plate; an organic light emitting layer, which is of a top-emitting type or a bottom-emitting type, disposed between the cover plate and the array substrate; and at least one first transparent resin layer disposed between the organic light emitting layer and the cover plate. With the solution in the disclosure, the method for manufacturing the display panel is simplified.

15 Claims, 3 Drawing Sheets

DISPLAY DEVICES, DISPLAY PANELS AND MANUFACTURING METHODS THEREFOR

CROSS-REFERENCES TO RELATED APPLICATIONS

This application claims priority to a Chinese patent application No. 201510540234.X filed on Aug. 28, 2015 and entitled "Display Device, Display Panel and Manufacturing Method Therefor", the disclosure of which is incorporated herein by reference in its entirety.

TECHNICAL BACKGROUND

With the rapid development of display technologies, display devices are increasingly widely adopted. The existing display devices generally include a liquid crystal display device and an organic light emitting display device. As compared to the liquid crystal display device, the organic light emitting display device includes a self-luminous organic light emitting layer without an additional backlight module, and hence receives more attentions.

The existing organic light emitting display device includes a cover plate, an array substrate, and an organic light emitting layer disposed between the cover plate and the array substrate. To encapsulate the organic light emitting display device, a plurality of support pins are necessarily arranged between the cover plate and the array substrate to support a space between the cover plate and the array substrate.

If the support pins for supporting the space between the cover plate and the array substrate are too long, a color mixing phenomenon might occur to the organic light emitting display device; otherwise, if the support pins are too short, a Newton ring phenomenon might occur to the organic light emitting display device, thereby leading to a degraded display effect. Therefore, the strict requirements for the height of the support pins certainly cause a difficulty in the process for manufacturing the organic light emitting display device. Furthermore, the material of the support pins per se leads to a shortened service life of the organic light emitting display device.

SUMMARY OF THE INVENTION

Embodiments of the present disclosure provide a display device, a display panel and a method for manufacturing the display panel to avoid the difficulty in the process for manufacturing the organic light emitting display device in the related art.

To this end, the present disclosure provides the following technical solutions.

In one aspect, embodiments of the present disclosure provide a display panel that includes a cover plate, an array substrate disposed opposite to the cover plate, an organic light emitting layer, which is of a top-emitting type or a bottom-emitting type, disposed between the cover plate and the array substrate; and at least one first transparent resin layer disposed between the organic light emitting layer and the cover plate.

In another aspect, embodiments of the present disclosure provide a display device including the above-described display panel.

In yet another aspect, embodiments of the present disclosure provide a method for manufacturing a display panel. The method includes forming a cover plate, forming an array substrate disposed opposite to the cover plate, forming an organic light emitting layer, which is of a top-emitting type or a bottom-emitting type, between the cover plate and the array substrate; and forming at least one first transparent resin layer between the organic light emitting layer and the cover plate.

In the display device, the display panel and the method for manufacturing the display panel according to the embodiments of the present disclosure, at least one first transparent resin layer is disposed between the organic light emitting layer and the cover plate to support the space between the organic light emitting layer and the cover plate, thus eliminating the need for the support pins and hence simplifying the method for manufacturing the display panel.

DESCRIPTION OF DRAWINGS

Other features and advantages of the present disclosure will become apparent from the detailed description of the non-limiting embodiments given with reference to the accompanying drawings, in which.

DETAILED DESCRIPTION OF THE EMBODIMENTS

The present disclosure will be described in detail in combination with the accompanying drawings and the embodiments. It should be understood that the specific embodiments described herein are intended to explain the present disclosure but not to be considered as a limitation to the present disclosure. Moreover, merely parts relating to the present disclosure are illustrated in the accompanying drawings for ease of description.

Embodiments of the present disclosure provide a display panel.

Figure 1:
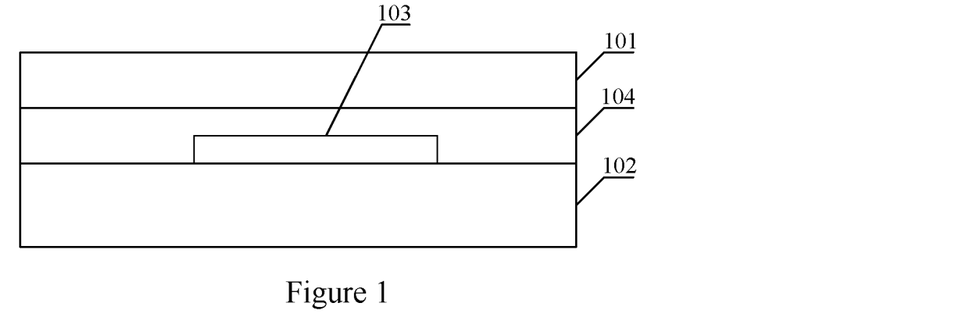
FIG. 1 is a structural view showing an implementation of a display panel according to an embodiment of the present disclosure.

FIG. 1 is a structural view showing an implementation of a display panel according to an embodiment of the present disclosure. As shown in FIG. 1, in this embodiment, the display panel includes: a cover plate 101, an array substrate 102, an organic light emitting layer 103 and at least one first transparent resin layer 104. The array substrate 102 is disposed opposite to the cover plate 101. The organic light emitting layer 103, which may be of a top-emitting type or a bottom-emitting type, is disposed between the cover plate 101 and the array substrate 102. The at least one first transparent resin layer 104 is disposed between the organic light emitting layer 103 and the cover plate 101.

In the display panel as shown in FIG. 1, the at least one first transparent resin layer is disposed between the organic light emitting layer and the cover plate to support a space between the organic light emitting layer and the cover plate, without the need for the support pins, so that the method for manufacturing the display panel is simplified. Since the support pins are eliminated, the degraded display effect caused by the excessively long or short support pins can be avoided, thereby obtaining an improved display effect. In addition, since the material of the support pins which has a relative short service life is not used in the display panel, the service life of the display panel can be prolonged.

The at least one first transparent resin layer 104 may be made of one transparent resin or a mixture of at least two transparent resins. Herein, the transparent resin may be polymethyl methacrylate, epoxy resin, polyacrylic acid, polyethylene, polystyrene, styrene-acrylonitrile copolymer, acrylonitrile-butadiene-styrene copolymer, ethylene-vinyl acetate copolymer, polyethylene terephthalate, polybutylene terephthalate, polyamide, polyoxymethylene, polycarbonate, polyphenylene ether, polyphenylene sulfide or polyurethane. The at least one first transparent resin layer 104 may have a thickness larger than or equal to 1 micrometer (μm) and less than or equal to 10 millimeters (mm), without additionally increasing the thickness of the display panel, while well supporting the space between the organic light emitting layer and the cover plate.

For the organic light emitting layer 103 that is of the top-emitting type (i.e. light of the display panel is emitted from the cover plate 101), the cover plate 101 is made of light-transmitting material. For the organic light emitting layer 103 that is of the bottom-emitting type (i.e. light of the display panel is emitted from the array substrate 102), the array substrate 102 is made of light-transmitting material.

In some embodiments, when the organic light emitting layer 103 is of the top-emitting type, any one or more of the at least one first transparent resin layer 104 is doped with scattering particles to enhance a light extracting rate of the display panel, so that power consumption by the organic light emitting layer 103 for emitting light is decreased given the constant brightness of the display panel, thereby lowering a usage cost of the display panel.

The scattering particles may be formed by any one or a combination of at least two of nano silicon, carbon 60 (C-60), carbon nanotube, zirconium dioxide, zinc sulfide or oxide nanoparticles. A ratio of the scattering particles in the at least one first transparent resin layer 104 by quality is larger than or equal to 5% and less than or equal to 50%. For example, when the ratio of the scattering particles (with a radius of 5 nm, for example) in the at least one first transparent resin layer 104 (which is made of polyethersulfone with a refractive index of 1.82) by quality is 20%, the light extracting rate of the display panel is enhanced by 40% to 50%.

In some embodiments, the refractive index of the scattering particles is less than that of any one or more of the at least one first transparent resin layer 104 doped with the scattering particles. The refractive index of the at least one first transparent resin layer 104 may be larger than 1.58, in this case, the ratio of the scattering particles in the at least one first transparent resin layer 104 by quality is 15% to 35%, thereby enhancing the light extracting rate of the display panel.

In some embodiments, any one or more of the at least one first transparent resin layer 104 is doped with any one of or a mixture of at least two of antioxidant particles, water resistant particles, toughening particles or compatible particles, to improve oxidation resistance, water resistance, toughness or compatibility of the display panel, thereby prolonging the service life of the display panel.

The scattering particles, the antioxidant particles, the water resistant particles, the toughening particles or the compatible particles each have a size larger than or equal to 10 nm and less than or equal to 100 nm. Given that the sizes of these particles range from 10 nm to 100 nm and are less than a wavelength (of 400 nm to 700 nm) of the visible light, a visible light beam incident onto the at least one first transparent resin layer 104 doped with any one of or a mixture of at least two of the scattering particles, the antioxidant particles, the water resistant particles, the toughening particles or the compatible particles is substantially scattered, resulting in an observable light path, i.e. Tyndall effect. The intensity of the scattered light under the Tyndall effect is calculated by a Rayleigh formula (1) below:

$$I = \frac{9\pi^2 V^2 C}{2\lambda^4 l^2}\left(\frac{n^2 - n_0^2}{n^2 - 2n_0^2}\right)(1 + \cos^2 \alpha)I_0, \qquad (1)$$

wherein $I_0$ and $\lambda$ denote an intensity and a wavelength of the incident light, respectively; n and $n_0$ denote a scattering phase and a refractive index of a scattering medium, respectively; $\alpha$ denotes a scattering angle; V denotes a volume of a single scattering phase particle; C denotes a number density of a scattering phase; and I denotes a distance between an observed value and a scattering center.

As per formula (1), the value of C can be calculated given that $I_0$, $\lambda$, n, $n_0$, $\alpha$, V, and I are known, and hence the number of the doped particles is obtained.

Figure 2:
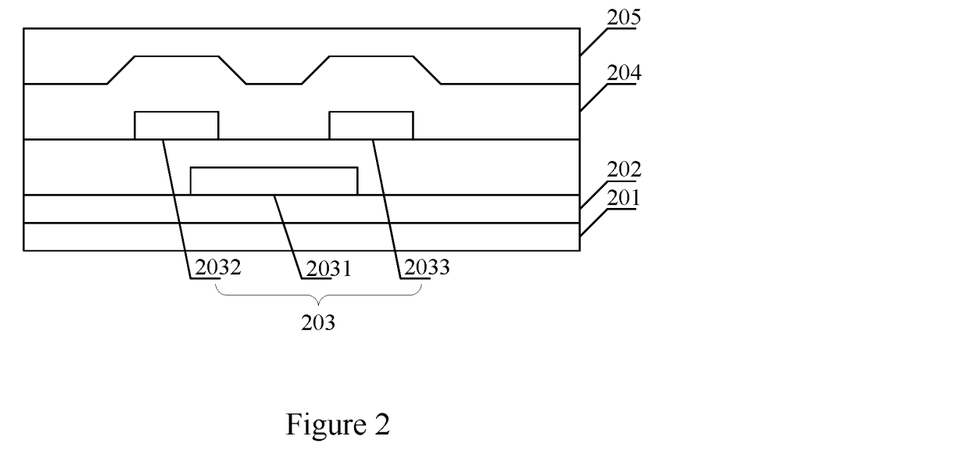
FIG. 2 is a structural view of an array substrate as shown in FIG. 1.

As shown in FIG. 2 which is a structural view of an array substrate as shown in FIG. 1, the array substrate includes: a substrate 201, a buffer layer 202, a Thin-Film Transistor (TFT) 203, a passivation layer 204 and a planarization layer 205. The TFT 203 includes a gate electrode 2031, a source electrode 2032 and a drain electrode 2033. The buffer layer 202 is disposed above the substrate 201, the TFT 203 is disposed above the buffer layer 202, the passivation layer 204 is dispose above the TFT 203, and the planarization layer 205 is disposed above the passivation layer 204. Alternatively, the array substrate can include a plurality of Thin-Film Transistors. In an example, only one Thin-Film Transistor is provided in this embodiment.

It is noted that the cover plate 101 or the substrate 201 may be embodied as a non-flexible substrate made of glass or ceramic, or may be embodied as a flexible substrate made of plastic. When both the cover plate 101 and the substrate 201 are flexible substrates, the resultant display panel is a flexible display panel.

In some embodiments, when both the cover plate 101 and the substrate 201 are flexible, the cover plate 101 and/or the substrate 201 is doped with any one of or a mixture of at least two of scattering particles, antioxidant particles, water resistant particles, toughening particles or compatible particles, to lower the usage cost of the display panel and improve oxidation resistance, water resistance, toughness or compatibility of the display panel, thereby prolonging the service life of the display panel.

Figure 3:
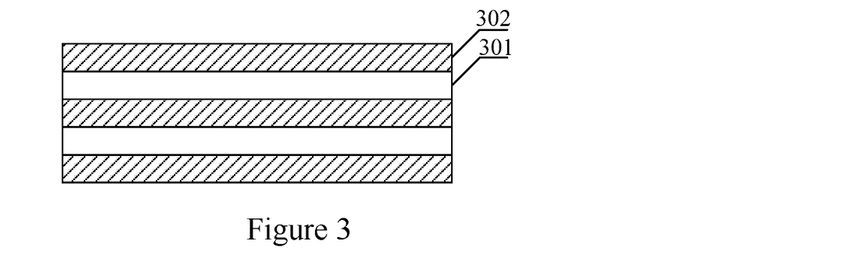
FIG. 3 is a structural view of a cover plate as shown in FIG. 1.

As shown in FIG. 3 which is a structural view of a cover plate shown in FIG. 1, in this embodiment, the cover plate includes a stacked structure formed by at least one organic layer 301 and at least one non-organic layer 302. The organic layer 301 is doped with any one of or a mixture of at least two of scattering particles, antioxidant particles, water resistant particles, toughening particles or compatible particles to lower the usage cost of the display panel and improve oxidation resistance, water resistance, toughness or compatibility of the display panel, thereby prolonging the service life of the display panel.

In some embodiments, any one or at least two of the buffer layer 202, the passivation layer 204 and the planarization layer 205 is doped with any one of or a mixture of at least two of scattering particles, antioxidant particles, water resistant particles, toughening particles, or compatible particles, to enhance the light extracting rate, oxidation resistance, water resistance, toughness or compatibility of the display panel, thereby improving the display effect of the display panel and prolonging the service life of the display panel.

Figure 4:
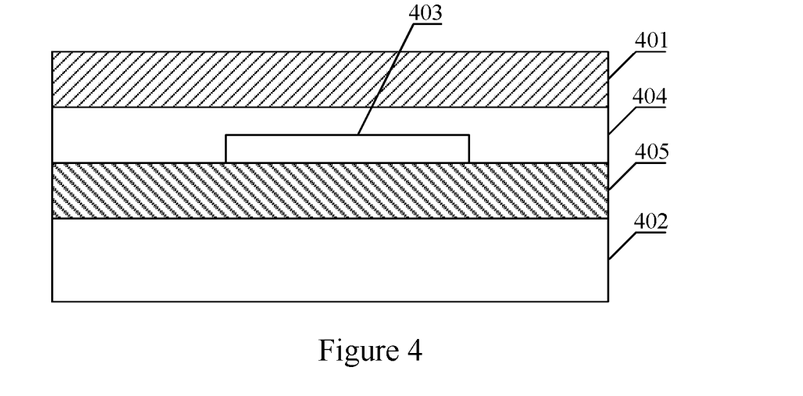
FIG. 4 is a structural view showing another implementation of a display panel according to the embodiment of the present disclosure.

FIG. 4 is a structural view showing another implementation of a display panel according to the embodiment of the present disclosure. As shown in FIG. 4, the display panel includes: a cover plate 401, an array substrate 402, an organic light emitting layer 403, at least one first transparent resin layer 404 and at least one second transparent resin layer 405. The array substrate 402 is disposed opposite to the cover plate 401, the organic light emitting layer 403, which may be of a bottom-emitting type, is disposed between the cover plate 401 and the array substrate 402, the at least one first transparent resin layer 404 is disposed between the organic light emitting layer 403 and the cover plate 401, and the at least one second transparent resin layer 405 is disposed between the organic light emitting layer 403 and the array substrate 402. Here, any one or more of the at least one second transparent resin layer 405 is doped with scattering particles.

In the display panel as shown in FIG. 4, the at least one first transparent resin layer is disposed between the organic light emitting layer and the cover plate to support a space between the organic light emitting layer and the cover plate, without the need for the support pins, so that the method for manufacturing the display panel is simplified, the display effect is improved, and the service life of the display panel can be prolonged. Furthermore, any one or more of the at least one second transparent resin layer is doped with scattering particles to enhance a light extracting rate of the display panel, so that power consumption by the organic light emitting layer for emitting light is decreased given the constant brightness of the display panel, thereby lowering a usage cost of the display panel.

The scattering particles may be formed by any one or a combination of at least two of nano silicon, C-60, carbon nanotube, zirconium dioxide, zinc sulfide or oxide nanoparticles. A ratio of the scattering particles in the at least one second transparent resin layer 405 by quality is larger than or equal to 5% and less than or equal to 50%. For example, when the ratio of the scattering particles (with a radius of 5 nm, for example) in the at least one second transparent resin layer 405 (which is made of polyethersulfone with a refractive index of 1.82) by quality is 20%, the light extracting rate of the display panel is enhanced by 40% to 50%.

In some embodiments, the refractive index of the scattering particles is less than that of any one or more of the at least one second transparent resin layer 405 doped with the scattering particles. The refractive index of the at least one second transparent resin layer 405 may be larger than 1.58. In this case, the ratio of the scattering particles in the at least one second transparent resin layer 405 by quality is 15% to 35%, thereby enhancing the light extracting rate of the display panel.

The at least one first transparent resin layer 404 and the at least one second transparent resin layer 405 may be made of one transparent resin or a mixture of at least two transparent resins. Herein, the transparent resin may be polymethyl methacrylate, epoxy resin, polyacrylic acid, polyethylene, polystyrene, styrene-acrylonitrile copolymer, acrylonitrile-butadiene-styrene copolymer, ethylene-vinyl acetate copolymer, polyethylene terephthalate, polybutylene terephthalate, polyamide, polyoxymethylene, polycarbonate, polyphenylene ether, polyphenylene sulfide or polyurethane. The at least one first transparent resin layer 404 and the at least one second transparent resin layer 405 may have a thickness larger than or equal to 1 μm and less than or equal to 10 mm, without additionally increasing the thickness of the display panel, while well supporting the space between the organic light emitting layer and the cover plate and providing the medium doped with the scattering particles.

Here, the organic light emitting layer 403 is of the bottom-emitting type (i.e. light of the display panel is emitted from the array substrate 402), and the array substrate 402 is made of light-transmitting material.

In some embodiments, any one or more of the at least one first transparent resin layer 404 and/or the at least one second transparent resin layer 405 is doped with any one of or a mixture of at least two of antioxidant particles, water resistant particles, toughening particles, or compatible particles, to improve oxidation resistance, water resistance, toughness or compatibility of the display panel, thereby prolonging the service life of the display panel.

The scattering particles, the antioxidant particles, the water resistant particles, the toughening particles or the compatible particles each have a size larger than or equal to 10 nm and less than or equal to 100 nm. Given that the sizes of these particles range from 10 nm to 100 nm and are less than a wavelength (of 400 nm to 700 nm) of the visible light, a visible light beam incident onto the at least one first transparent resin layer 404 and/or the at least one second transparent resin layer 405 doped with any one of or a mixture of at least two of the scattering particles, the antioxidant particles, the water resistant particles, the toughening particles or the compatible particles is substantially scattered, resulting in an observable light path, i.e. Tyndall effect. The number of the doped particles may be calculated by the above Rayleigh formula (1).

The array substrate and the cover plate of the display panel shown in FIG. 4 have structures same as those shown in FIG. 2 and FIG. 3, and reference made to the description for structures shown in FIG. 2 and FIG. 3 are for the detailed description of the array substrate and the cover plate of the display panel shown in FIG. 4.

Figure 5:
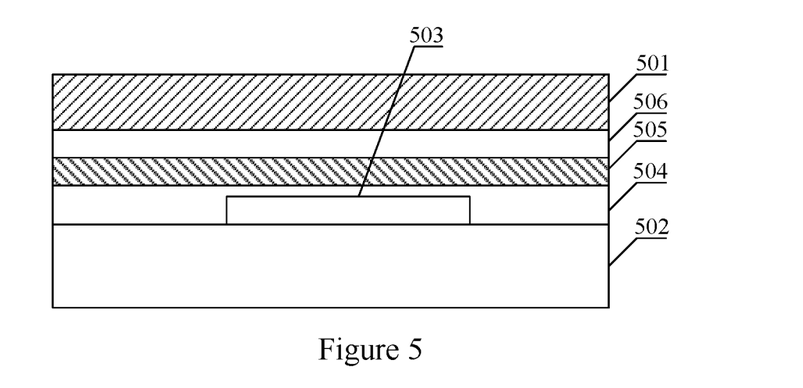
FIG. 5 is a structural view showing another implementation of a display panel according to the embodiment of the present disclosure.

FIG. 5 is a structural view showing another implementation of a display panel according to one embodiment of the present disclosure. As shown in FIG. 5, the display panel includes: a cover plate 501, an array substrate 502, an organic light emitting layer 503, a first transparent resin sub-layer 504, a second transparent resin sub-layer 505, and a third transparent resin sub-layer 506. In this embodiment, the array substrate 502 is disposed opposite to the cover plate 501, the organic light emitting layer 503, which may be of a top-emitting type, is disposed between the cover plate 501 and the array substrate 502, the first transparent resin sub-layer 504, the second transparent resin sub-layer 505 and the third transparent resin sub-layer 506 are disposed between the organic light emitting layer 503 and the cover plate 501 and are stacked sequentially in a direction from the organic light emitting layer 503 to the cover plate 501. The organic light emitting layer 503 is covered by the first transparent resin sub-layer 504, the second transparent resin sub-layer 505 is doped with scattering particles, and the third transparent resin sub-layer 506 is configured to match with the refractive index of the second transparent resin sub-layer 505 and the refractive index of the cover plate 501.

In the display panel shown in FIG. 5, the first transparent resin sub-layer is disposed between the organic light emitting layer and the cover plate to cover the organic light emitting layer, thereby planarizing the upper surface of the organic light emitting layer; the second transparent resin sub-layer doped with scatting particles is disposed between the first transparent resin sub-layer and the cover plate, to enhance the light extracting rate of the display panel, so that power consumption by the organic light emitting layer for emitting light is decreased given the constant brightness of the display panel, thereby lowering a usage cost of the display panel. Furthermore, the third transparent resin sub-layer configured to match with the refractive index of the second transparent resin sub-layer and the refractive index of the cover plate is disposed between the second transparent resin sub-layer and the cover plate, to alleviate an impact caused by a difference between the refractive index of the second transparent resin sub-layer and the refractive index of the cover plate (generally the refractive index of the scattering particles is larger than the refractive index of the cover plate), and hence improve the light extracting quality of the display panel, thereby improving the display effect of the display panel. The first transparent resin sub-layer, the second transparent resin sub-layer and the third transparent resin sub-layer are disposed between the organic light emitting layer and the cover plate to support a space between the organic light emitting layer and the cover plate, without the need for the support pins, so that the method for manufacturing the display panel is simplified, the display effect is improved, and the service life of the display panel can be prolonged.

Referring to the display panel shown in FIG. 1, the display panel shown in FIG. 5 is obtained by replacing the at least one first transparent resin layer by a structure including three resin sub-layers, thereby avoiding the shortage of a single resin layer, and enhancing the light extracting rate of the display panel to up to 95%.

The scattering particles may be formed by any one or a combination of at least two of nano silicon, C-60, carbon nanotube, zirconium dioxide, zinc sulfide or oxide nanoparticles. A ratio of the scattering particles in the second transparent resin sub-layer 505 by quality is larger than or equal to 5% and less than or equal to 50%. For example, when the ratio of the scattering particles (with a radius of 5 nm, for example) in the second transparent resin sub-layer 505 (which is made of polyethersulfone with a refractive index of 1.82) by quality is 20%, the light extracting rate of the display panel is enhanced by 40% to 50%.

In some embodiments, the refractive index of the scattering particles is less than that of the second transparent resin sub-layer 505 doped with the scattering particles. The refractive index of the second transparent resin sub-layer 505 may be larger than 1.58, in this case, the ratio of the scattering particles in the second transparent resin sub-layer 505 by quality is 15% to 35%, thereby enhancing the light extracting rate of the display panel.

In some embodiments, a difference between the thickness of the first transparent resin sub-layer 504 and the thickness of the organic light emitting layer 503 may be larger than or equal to 10 nm and less than or equal to 1 μm, and the refractive index of the first transparent resin sub-layer 504 may be larger than or equal to 1.5 and less than or equal to 2.2. The thickness of the second transparent resin sub-layer 505 may be larger than or equal to 100 nm and less than or equal to 2000 nm, and the refractive index of the second transparent resin sub-layer 505 may be larger than or equal to 1.6 and less than or equal to 2.3. The thickness of the third transparent resin sub-layer 506 may be larger than or equal to 100 nm and less than or equal to 2000 nm, and the refractive index of the third transparent resin sub-layer 506 may be larger than or equal to 1.1 and less than or equal to 1.8.

The first transparent resin sub-layer 504, the second transparent resin sub-layer 505 and the third transparent resin sub-layer 506 may be made of one transparent resin or a mixture of at least two transparent resins. Herein, the transparent resin may be polymethyl methacrylate, epoxy resin, polyacrylic acid, polyethylene, polystyrene, styrene-acrylonitrile copolymer, acrylonitrile-butadiene-styrene copolymer, ethylene-vinyl acetate copolymer, polyethylene terephthalate, polybutylene terephthalate, polyamide, polyoxymethylene, polycarbonate, polyphenylene ether, polyphenylene sulfide or polyurethane.

Here, the organic light emitting layer 503 is of the top-emitting type (i.e. light of the display panel is emitted from the cover plate 501), and the cover plate 501 is made of light-transmitting material.

In some embodiments, the first transparent resin sub-layer 504, the second transparent resin sub-layer 505 or the third transparent resin sub-layer 506 is doped with any one of or a mixture of at least two of antioxidant particles, water resistant particles, toughening particles, or compatible particles, to improve oxidation resistance, water resistance, toughness or compatibility of the display panel, thereby prolonging the service life of the display panel.

The scattering particles, the antioxidant particles, the water resistant particles, the toughening particles or the compatible particles each have a size larger than or equal to 10 nm and less than or equal to 100 nm. Given that the sizes of these particles range from 10 nm to 100 nm and are less than a wavelength (of 400 nm to 700 nm) of the visible light, a visible light beam incident onto the first transparent resin sub-layer 504, the second transparent resin sub-layer 505 or the third transparent resin sub-layer 506 doped with any one of or a mixture of at least two of the scattering particles, the antioxidant particles, the water resistant particles, the toughening particles or the compatible particles is substantially scattered, resulting in an observable light path, i.e. Tyndall effect. The number of the doped particles may be calculated by the above Rayleigh formula (1).

The array substrate and the cover plate of the display panel shown in FIG. 5 have structures same as those shown in FIG. 2 and FIG. 3, respectively, and reference for the description given in combination with FIG. 2 and FIG. 3 are applied to the detailed description of the array substrate and the cover plate of the display panel shown in FIG. 5.

Figure 6:
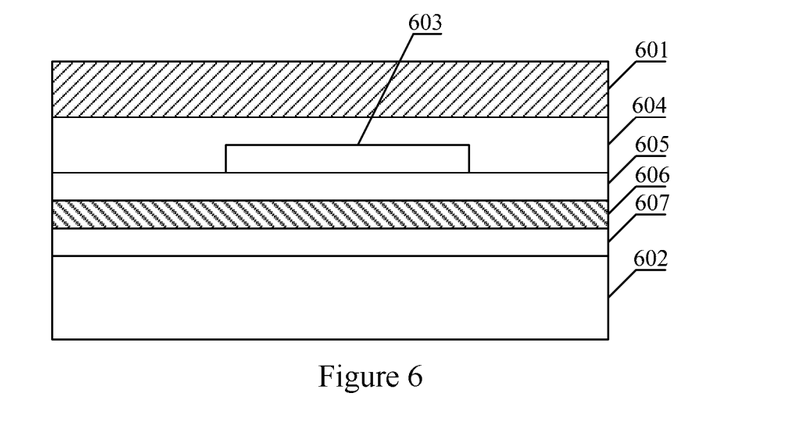
FIG. 6 is a structural view showing another implementation of a display panel according to the embodiment of the present disclosure.

FIG. 6 is a structural view showing another implementation of a display panel according to the embodiment of the present disclosure. As shown in FIG. 6, the display panel includes: a cover plate 601, an array substrate 602, an organic light emitting layer 603, at least one first transparent resin layer 604, a first transparent resin sub-layer 605, a second transparent resin sub-layer 606, and a third transparent resin sub-layer 607. The array substrate 602 is disposed opposite to the cover plate 601, the organic light emitting layer 603, which may be of a bottom-emitting type, is disposed between the cover plate 601 and the array substrate 602; the at least one first transparent resin layer 604 is disposed between the organic light emitting layer 603 and the cover plate 601; the first transparent resin sub-layer 605, the second transparent resin sub-layer 606 and the third transparent resin sub-layer 607 are disposed between the organic light emitting layer 603 and the cover plate 602 and are stacked sequentially in a direction from the organic light emitting layer 603 to the array substrate 602. The organic light emitting layer 603 is covered by the first transparent resin sub-layer 605 in the direction from the organic light emitting layer 603 to the array substrate 602, the second transparent resin sub-layer 606 is doped with scattering particles, and the third transparent resin sub-layer 607 is configured to match with the refractive index of the second transparent resin sub-layer and the refractive index of the array substrate 602.

In the display panel shown in FIG. 6, the at least one first transparent resin layer is disposed between the organic light emitting layer and the cover plate to support a space between the organic light emitting layer and the cover plate, without the need for the support pins, so that the method for manufacturing the display panel is simplified, the display effect is improved, and the service life of the display panel can be prolonged. The first transparent resin sub-layer is disposed between the organic light emitting layer and the array substrate to cover the organic light emitting layer, thereby planarizing the lower surface of the organic light emitting layer; the second transparent resin sub-layer doped with scatting particles is disposed between the first transparent resin sub-layer and the array substrate, to enhance the light extracting rate of the display panel, so that power consumption by the organic light emitting layer for emitting light is decreased given the constant brightness of the display panel, thereby lowering a usage cost of the display panel. Furthermore, the third transparent resin sub-layer configured to match with the refractive index of the second transparent resin sub-layer and the refractive index of the cover plate is disposed between the second transparent resin sub-layer and the array substrate, to alleviate an impact caused by a difference between the refractive index of the second transparent resin sub-layer and the refractive index of the array substrate (generally the refractive index of the scattering particles is larger than the refractive index of the array substrate), and hence improve the light extracting quality of the display panel, thereby improving the display effect of the display panel.

Referring to the display panel shown in FIG. 4, the display panel shown in FIG. 6 is obtained by replacing the at least one second transparent resin layer by a structure including three resin sub-layers, thereby avoiding the shortage of at least two single resin layers, and enhancing the light extracting rate of the display panel to up to 95%.

The scattering particles may be formed by any one or a combination of at least two of nano silicon, C-60, carbon nanotube, zirconium dioxide, zinc sulfide or oxide nanoparticles. A ratio of the scattering particles in the second transparent resin sub-layer 606 by quality is larger than or equal to 5% and less than or equal to 50%. For example, when the ratio of the scattering particles (with a radius of 5 nm, for example) in the second transparent resin sub-layer 606 (which is made of polyethersulfone with a refractive index of 1.82) by quality is 20%, the light extracting rate of the display panel is enhanced by 40% to 50%.

In some embodiments, the refractive index of the scattering particles is less than that of the second transparent resin sub-layer 606 doped with the scattering particles. The refractive index of the second transparent resin sub-layer 606 may be larger than 1.58, in this case, the ratio of the scattering particles in the second transparent resin sub-layer 606 by quality is 15% to 35%, thereby enhancing the light extracting rate of the display panel.

In some embodiments, a difference between the thickness of the first transparent resin sub-layer 605 and the thickness of the organic light emitting layer 603 may be larger than or equal to 10 nm and less than or equal to 1 μm, and the refractive index of the first transparent resin sub-layer 605 may be larger than or equal to 1.5 and less than or equal to 2.2. The thickness of the second transparent resin sub-layer 606 may be larger than or equal to 100 nm and less than or equal to 2000 nm, and the refractive index of the second transparent resin sub-layer 606 may be larger than or equal to 1.6 and less than or equal to 2.3. The thickness of the third transparent resin sub-layer 607 may be larger than or equal to 100 nm and less than or equal to 2000 nm, and the refractive index of the third transparent resin sub-layer 607 may be larger than or equal to 1.1 and less than or equal to 1.8.

The first transparent resin sub-layer 605, the second transparent resin sub-layer 606 and the third transparent resin sub-layer 607 may be made of one transparent resin or a mixture of at least two transparent resins. Herein, the transparent resin may be polymethyl methacrylate, epoxy resin, polyacrylic acid, polyethylene, polystyrene, styrene-acrylonitrile copolymer, acrylonitrile-butadiene-styrene copolymer, ethylene-vinyl acetate copolymer, polyethylene terephthalate, polybutylene terephthalate, polyamide, polyoxymethylene, polycarbonate, polyphenylene ether, polyphenylene sulfide or polyurethane.

In this embodiment, the organic light emitting layer 603 is of the bottom-emitting type (i.e. light of the display panel is emitted from the array substrate 602), and the array substrate 602 is made of light-transmitting material.

In some embodiments, the first transparent resin sub-layer 605, the second transparent resin sub-layer 606 or the third transparent resin sub-layer 607 is doped with any one of or a mixture of at least two of antioxidant particles, water resistant particles, toughening particles, or compatible particles, to improve oxidation resistance, water resistance, toughness or compatibility of the display panel, thereby prolonging the service life of the display panel.

The scattering particles, the antioxidant particles, the water resistant particles, the toughening particles or the compatible particles each have a size larger than or equal to 10 nm and less than or equal to 100 nm. Given that the sizes of these particles range from 10 nm to 100 nm and are less than a wavelength (of 400 nm to 700 nm) of the visible light, a visible light beam incident onto the first transparent resin sub-layer 605, the second transparent resin sub-layer 606 or the third transparent resin sub-layer 607 doped with any one of or a mixture of at least two of the scattering particles, the antioxidant particles, the water resistant particles, the toughening particles or the compatible particles is substantially scattered, resulting in an observable light path, i.e. Tyndall effect. The number of the doped particles may be calculated by the above Rayleigh formula (1).

The array substrate and the cover plate of the display panel shown in FIG. 6 have structures same as those shown in FIG. 2 and FIG. 3, and reference for the description given in combination with FIG. 2 and FIG. 3 are made for the detailed description of the array substrate and the cover plate of the display panel shown in FIG. 6.

Embodiments of the present disclosure further provide a display device, which includes the display panel in any one of the above embodiments shown in FIG. 1, FIG. 4 to FIG. 6.

In the display device according to the embodiment of the present disclosure, at least one first transparent resin layer is disposed between the organic light emitting layer and the cover plate to support a space between the organic light emitting layer and the cover plate, without the need for the support pins, so that the method for manufacturing the display panel is simplified, the display effect is improved, and the service life of the display device can be prolonged.

Embodiments of the present disclosure further provide a method for manufacturing a display panel.

Figure 7:
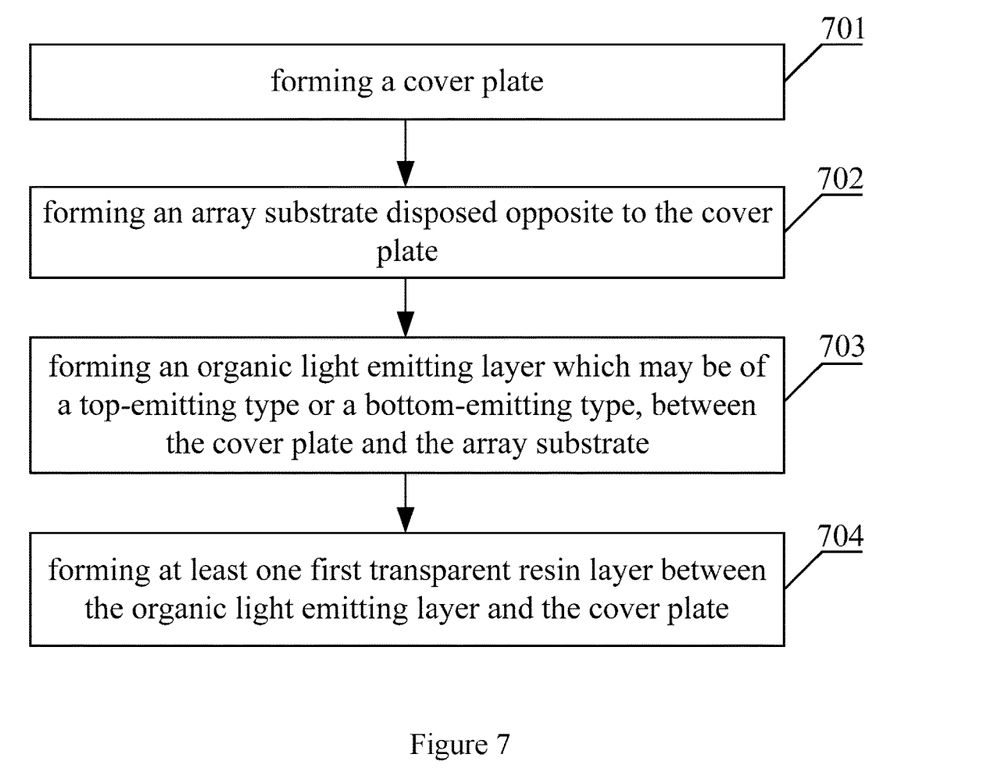
FIG. 7 is a flow chart showing a method for manufacturing a display panel according to an embodiment of the present disclosure.

FIG. 7 is a flow chart showing a method for manufacturing a display panel according to an embodiment of the present disclosure. The method includes Steps 701, 702, 703 and 704 below.

Step 701 includes forming a cover plate.

It is noted that the cover plate may be embodied as a non-flexible substrate made of glass or ceramic, or may be embodied as a flexible substrate made of plastic.

Step 702 includes forming an array substrate disposed opposite to the cover plate.

The array substrate includes a substrate, which may be embodied as a non-flexible substrate made of glass or ceramic, or may be embodied as a flexible substrate made of plastic. When both the cover plate and the substrate are flexible substrates, the resultant display panel is a flexible display panel.

When both the cover plate and the substrate are flexible, the cover plate and/or the substrate is doped with any one of or a mixture of at least two of scattering particles, antioxidant particles, water resistant particles, toughening particles or compatible particles, to lower the usage cost of the display panel and improve oxidation resistance, water resistance, toughness or compatibility of the display panel, thereby prolonging the service life of the display panel.

Step 703 includes forming an organic light emitting layer, which may be of a top-emitting type or a bottom-emitting type, between the cover plate and the array substrate.

For the organic light emitting layer that is of the top-emitting type (i.e. light of the display panel is emitted from the cover plate), the cover plate is made of light-transmitting material, and for the organic light emitting layer that is of the bottom-emitting type (i.e. light of the display panel is emitted from the array substrate), the array substrate is made of light-transmitting material.

Step 704 includes forming at least one first transparent resin layer between the organic light emitting layer and the cover plate.

For the organic light emitting layer that is of the top-emitting type, any one or more of the at least one first transparent resin layer is doped with scattering particles to enhance a light extracting rate of the display panel, so that power consumption by the organic light emitting layer for emitting light is decreased given the constant brightness of the display panel, thereby lowering a usage cost of the display panel.

For the organic light emitting layer that is of the bottom-emitting type, the method may further includes forming at least one second transparent resin layer between the organic light emitting layer and the array substrate, where any one or more of the at least one second transparent resin layer is doped with scattering particles to enhance a light extracting rate of the display panel, so that power consumption by the organic light emitting layer for emitting light is decreased given the constant brightness of the display panel, thereby lowering a usage cost of the display panel.

The at least one first transparent resin layer and the at least one second transparent resin layer may be made of one transparent resin or a mixture of at least two transparent resins. The transparent resin may be polymethyl methacrylate, epoxy resin, polyacrylic acid, polyethylene, polystyrene, styrene-acrylonitrile copolymer, acrylonitrile-butadiene-styrene copolymer, ethylene-vinyl acetate copolymer, polyethylene terephthalate, polybutylene terephthalate, polyamide, polyoxymethylene, polycarbonate, polyphenylene ether, polyphenylene sulfide or polyurethane. The at least one first transparent resin layer and the at least one second transparent resin layer may each have a thickness larger than or equal to 1 μm and less than or equal to 10 mm.

Any one or more of the at least one first transparent resin layer and/or the at least one second transparent resin layer is doped with any one of or a mixture of at least two of antioxidant particles, water resistant particles, toughening particles or compatible particles, to improve oxidation resistance, water resistance, toughness or compatibility of the display panel, thereby prolonging the service life of the display panel.

The method may further include: forming a buffer layer on the substrate, forming a TFT on the buffer layer, forming a passivation layer on the TFT, and forming a planarization layer on the passivation layer. Any one or more of the buffer layer, the passivation layer and the planarization layer is doped with any one of or a mixture of at least two of scatting particles, antioxidant particles, water resistant particles, toughening particles or compatible particles, to lower a usage cost of the display panel and improve oxidation resistance, water resistance, toughness or compatibility of the display panel, thereby prolonging the service life of the display panel.

In the method for manufacturing the display panel according to the embodiment of the present disclosure, at least one first transparent resin layer is disposed between the organic light emitting layer and the cover plate to support a space between the organic light emitting layer and the cover plate, without the need for the support pins, so that the method for manufacturing the display panel is simplified, the display effect is improved, and the service life of the display panel can be prolonged.

Although some embodiments and the applied technology principles of the present disclosure have been described as above, it should be understood by those skilled in the art that the present disclosure is not limited to particular embodiments described herein. Various modifications, readjustment and alternations can be made by those skilled in the art without departing the scope of protection of the present disclosure, and these modifications, readjustment and alternations fall within the scope of the present disclosure which is subject to the appended claims.

The invention claimed is:

1. A display panel, comprising:
   a cover plate;
   an array substrate disposed opposite to the cover plate;
   an organic light emitting layer, which is of a top-emitting type or a bottom-emitting type, disposed between the cover plate and the array substrate; and
   at least one first transparent resin layer disposed between the organic light emitting layer and the cover plate,
   wherein for the organic light emitting layer that is of the top-emitting type, one or more of the at least one first transparent resin layer is doped with scattering particles, and
   for the organic light emitting layer that is of the bottom-emitting type, the display panel further comprises: at least one second transparent resin layer disposed between the organic light emitting layer and the array substrate, wherein one or more of the at least one second transparent resin layer is doped with the scattering particles, wherein the at least one first transparent resin layer and/or the at least one second transparent resin layer comprises a first transparent resin sub-layer, a second transparent resin sub-layer and a third transparent resin sub-layer sequentially stacked in a direction departing from the organic light emitting layer, wherein the organic light emitting layer is covered by the first transparent resin sub-layer, the second transparent resin sub-layer is doped with the scattering particles, and the third transparent resin sub-layer is configured to match with a refractive index of the second transparent resin sub-layer and a refractive index of the cover plate or the array substrate.

2. The display panel of claim 1, wherein a difference between a thickness of the first transparent resin sub-layer and a thickness of the organic light emitting layer is larger than or equal to 10 nm and less than or equal to 1 µm, a refractive index of the first transparent resin sub-layer is larger than or equal to 1.5 and less than or equal to 2.2, a thickness of the second transparent resin sub-layer is larger than or equal to 100 nm and less than or equal to 2000 nm, the refractive index of the second transparent resin sub-layer is larger than or equal to 1.6 and less than or equal to 2.3, a thickness of the third transparent resin sub-layer is larger than or equal to 100 nm and less than or equal to 2000 nm, and a refractive index of the third transparent resin sub-layer is larger than or equal to 1.1 and less than or equal to 1.8.

3. The display panel of claim 1, wherein a refractive index of the scattering particles is less than that of the first transparent resin layer doped with the scattering particles or the second transparent resin layer doped with the scattering particles.

4. The display panel of claim 1, wherein one or more of the at least one first transparent resin layer and/or the at least one second transparent resin layer is doped with any one of or a mixture of at least two of antioxidant particles, water resistant particles, toughening particles or compatible particles.

5. The display panel of claim 1, wherein the array substrate comprises a substrate, and the cover plate and the substrate of the array substrate each are non-flexible substrates or flexible substrates.

6. The display panel of claim 5, wherein when both the cover plate and the substrate of the array substrate are flexible substrates, the cover plate and/or the substrate of the array substrate is doped with any one of or a mixture of at least two of scattering particles, antioxidant particles, water resistant particles, toughening particles or compatible particles.

7. The display panel of claim 6, wherein the cover plate comprises a stacked structure formed by at least one organic layer and at least one inorganic layer, and the organic layer is doped with any one of or a mixture of at least two of the scattering particles, the antioxidant particles, the water resistant particles, the toughening particles or the compatible particles.

8. The display panel of claim 5, wherein the array substrate further comprises:
a buffer layer disposed on the substrate of the array substrate;
a thin film transistor disposed on the buffer;
a passivation layer disposed on the thin film transistor; and
a planarization layer disposed on the passivation layer, wherein
one or more of the buffer layer, the passivation layer and the planarization layer is doped with any one of or a mixture of at least two of scattering particles, antioxidant particles, water resistant particles, toughening particles or compatible particles.

9. A display device comprising a display panel, wherein the display panel comprises:
a cover plate;
an array substrate disposed opposite to the cover plate;
an organic light emitting layer, which is of a top-emitting type or a bottom-emitting type, disposed between the cover plate and the array substrate; and
at least one first transparent resin layer disposed between the organic light emitting layer and the cover plate;
wherein for the organic light emitting layer that is of the top-emitting type, one or more of the at least one first transparent resin layer is doped with scattering particles, and
for the organic light emitting layer that is of the bottom-emitting type, the display panel further comprises: at least one second transparent resin layer disposed between the organic light emitting layer and the array substrate, wherein one or more of the at least one second transparent resin layer is doped with the scattering particles,
wherein the at least one first transparent resin layer and/or the at least one second transparent resin layer comprises a first transparent resin sub-layer, a second transparent resin sub-layer and a third transparent resin sub-layer sequentially stacked in a direction departing from the organic light emitting layer, wherein the organic light emitting layer is covered by the first transparent resin sub-layer, the second transparent resin sub-layer is doped with the scattering particles, and the third transparent resin sub-layer is configured to match with a refractive index of the second transparent resin sub-layer and a refractive index of the cover plate or the array substrate.

10. The display device of claim 9, wherein a difference between a thickness of the first transparent resin sub-layer and a thickness of the organic light emitting layer is larger than or equal to 10 nm and less than or equal to 1 µm, a refractive index of the first transparent resin sub-layer is larger than or equal to 1.5 and less than or equal to 2.2, a thickness of the second transparent resin sub-layer is larger than or equal to 100 nm and less than or equal to 2000 nm, the refractive index of the second transparent resin sub-layer is larger than or equal to 1.6 and less than or equal to 2.3, a thickness of the third transparent resin sub-layer is larger than or equal to 100 nm and less than or equal to 2000 nm, and a refractive index of the third transparent resin sub-layer is larger than or equal to 1.1 and less than or equal to 1.8.

11. A method for manufacturing a display panel, comprising:
forming a cover plate;
forming an array substrate disposed opposite to the cover plate;
forming an organic light emitting layer, which may be of a top-emitting type or a bottom-emitting type, between the cover plate and the array substrate; and
forming at least one first transparent resin layer between the organic light emitting layer and the cover plate,
wherein for the organic light emitting layer that is of the top-emitting type, one or more of the at least one first transparent resin layer is doped with scattering particles, and
for the organic light emitting layer that is of the bottom-emitting type, the display panel further comprises: at least one second transparent resin layer disposed between the organic light emitting layer and the array substrate, wherein one or more of the at least one second transparent resin layer is doped with the scattering particles, wherein the at least one first transparent resin layer and/or the at least one second transparent resin layer comprises a first transparent resin sub-layer, a second transparent resin sub-layer and a third transparent resin sub-layer sequentially stacked in a direction departing from the organic light emitting layer, wherein the organic light emitting layer is covered by the first transparent resin sub-layer, the second transparent resin sub-layer is doped with the scattering particles, and the third transparent resin sub-layer is configured to match with a refractive index of the second transparent resin sub-layer and a refractive index of the cover plate or the array substrate.

12. The method of claim 11, wherein one or more of the at least one first transparent resin layer and/or the at least one second transparent resin layer is doped with any one of or a mixture of at least two of antioxidant particles, water resistant particles, toughening particles or compatible particles.

13. The method of claim 11, wherein the array substrate comprises a substrate, and the cover plate and the substrate of the array substrate each are non-flexible substrates or flexible substrates.

14. The method of claim 13, wherein when both the cover plate and the substrate of the array substrate are flexible substrates, the cover plate and/or the substrate of the array substrate is doped with any one of or a mixture of at least two of scattering particles, antioxidant particles, water resistant particles, toughening particles or compatible particles.

15. The method of claim 13, further comprising:
forming a buffer layer on the substrate of the array substrate;
forming a thin film transistor on the buffer;
forming a passivation layer on the thin film transistor; and
forming a planarization layer on the passivation layer, wherein
one or more of the buffer layer, the passivation layer and the planarization layer is doped with any one of or a mixture of at least two of scattering particles, antioxidant particles, water resistant particles, toughening particles or compatible particles.

* * * * *